United States Patent
Dennis et al.

(10) Patent No.: US 9,112,066 B2
(45) Date of Patent: *Aug. 18, 2015

(54) METHOD OF FABRICATING A SOLAR CELL WITH A TUNNEL DIELECTRIC LAYER

(71) Applicant: SunPower Corporation, San Jose, CA (US)

(72) Inventors: Tim Dennis, Canton, TX (US); Scott Harrington, Oakland, CA (US); Jane Manning, Woodside, CA (US); David D. Smith, Campbell, CA (US); Ann Waldhauer, La Honda, CA (US)

(73) Assignee: SunPower Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/157,386

(22) Filed: Jan. 16, 2014

(65) Prior Publication Data

US 2014/0134788 A1 May 15, 2014

Related U.S. Application Data

(63) Continuation of application No. 13/677,611, filed on Nov. 15, 2012, now Pat. No. 8,709,851, which is a continuation of application No. 12/829,922, filed on Jul. 2, 2010, now Pat. No. 8,334,161.

(51) Int. Cl.
*H01L 31/0368* (2006.01)
*H01L 31/0216* (2014.01)
*H01L 31/0236* (2006.01)
*H01L 31/068* (2012.01)
*H01L 31/18* (2006.01)

(52) U.S. Cl.
CPC ........ *H01L 31/0216* (2013.01); *H01L 31/0236* (2013.01); *H01L 31/02168* (2013.01); *H01L 31/03682* (2013.01); *H01L 31/068* (2013.01); *H01L 31/182* (2013.01); *H01L 31/1804* (2013.01); *H01L 31/1872* (2013.01); *Y02E 10/546* (2013.01); *Y02E 10/547* (2013.01)

(58) Field of Classification Search
USPC .............................................................. 438/57
See application file for complete search history.

(56) References Cited

U.S. PATENT DOCUMENTS

| | | | |
|---|---|---|---|
| 4,393,095 A | 7/1983 | Greenberg | |
| 5,057,439 A | 10/1991 | Swanson et al. | |
| 5,057,463 A | 10/1991 | Bryant et al. | |
| 5,693,578 A | 12/1997 | Nakanishi et al. | |
| 5,810,923 A * | 9/1998 | Yano et al. | 117/84 |

(Continued)

FOREIGN PATENT DOCUMENTS

JP  200264093  2/2002

OTHER PUBLICATIONS

Niel, S. et al., "An Investigation of Polysilicon Emitter Bipolar Transistors With an Ozonized Polysilicon/Monosilicon Interface," France Telecom, CNET Grenoble, BP98, F-38243 Meylan Cedex, France, 4 pgs.

(Continued)

*Primary Examiner* — Thao P Le
(74) *Attorney, Agent, or Firm* — Blakely Sokoloff Taylor Zafman LLP

(57) ABSTRACT

Method of fabricating solar cells with tunnel dielectric layers are described. Solar cells with tunnel dielectric layers are also described.

20 Claims, 6 Drawing Sheets

(56) References Cited

U.S. PATENT DOCUMENTS

| | | | |
|---|---|---|---|
| 6,916,717 | B2 | 7/2005 | Li et al. |
| 7,468,485 | B1 | 12/2008 | Swanson |
| 7,633,006 | B1 | 12/2009 | Swanson |
| 7,718,888 | B2 | 5/2010 | Cousins |
| 8,334,161 | B2 | 12/2012 | Dennis et al. |
| 2004/0229444 | A1* | 11/2004 | Couillard et al. ............ 438/455 |
| 2007/0256728 | A1 | 11/2007 | Cousins |
| 2008/0035198 | A1 | 2/2008 | Teppe et al. |
| 2008/0121279 | A1 | 5/2008 | Swanson |
| 2009/0314341 | A1 | 12/2009 | Borden et al. |

OTHER PUBLICATIONS

Simoen, Eddy et al., "Impact of Polysilicon Emitter Interfacial Layer Engineering on the 1 / f Noise of Bipolar Transistors," IEEE Transactions on Electron Devices, vol. 43, No. 12, Dec. 1996, pp. 2261-2268.

Bardwell, J. A. et al., "Physical and Electrical Characterization of Thin Anodic Oxides on Si(100)," J. Electrochem. Soc., vol. 142, No. 11, Nov. 1995, pp. 3933-3940.

Schmuki, P. et al., "In Situ Characterization of Anodic Silicon Oxide Films by AC Impedance Measurements," J. Electrochem. Soc., vol. 142, No. 5, May 1995, pp. 1705-1712.

Bardwell, J. A. et al., "Growth and characterization of anodic oxides on Si(100) formed in 0.1 M hydrochloric acid," J. Appl. Phys. vol. 79, No. 11, Jun. 1, 1996, pp. 8761-8769.

Hu, S. M., "Defects in silicon substrates," J. Vac. Sci. Technol., vol. 14, No. 1, Jan./Feb. 1977, pp. 17-31.

Dressendorfer, P. V., et al., "Processing dependence of metal/tunnel-oxide/silicon junctions," Appl. Phys. Lett. vol. 36, No. 10, May 15, 1980, pp. 850-852.

International Search Report and Written Opinion from PCT/US2011/034089 mailed Feb. 9, 2012, 9 pgs.

Non-Final Office Action from U.S. Appl. No. 12/829,922 mailed May 8, 2012, 12 pgs.

International Preliminary Report on Patentability from PCT/US2011/034089 mailed Jan. 17, 2013, 6 pgs.

Non-Final Office Action from U.S. Appl. No. 13/677,611 mailed Feb. 15, 2013, 8 pgs.

Office Action for Australian Patent Application No. 2011271682, mailed Apr. 22, 2014, 3 pgs.

Office Action for Australian Patent Application No. 2011271682, mailed Dec. 5, 2014, 5 pgs.

Aberle, A. G.: "Surface passivation of crystalline silicon solar cells: a review" Prog. Photovolt. Res. Appl. (2000), vol. 8, No. 5, p. 473-487.

Aberle, A. G.& University of New South Wales. Centre for Photovoltaic Engineering: "Crystalline silicon solar cells : advanced surface passivation and analysis." (1999), Sydney: Centre for Photovoltaic Engineering, University of New South Wales, Book ISBN,0733406459.

Office Action for Japanese Patent Application No. 2013-518387, mailed Sep. 24, 2014, 6pgs.

Decision of Rejection from Japanese Patent Application No. 2013-518387 mailed Mar. 31, 2015, 2 pgs.

Patent Examination Report No. 3 from Australian Patent Application No. 2011271682 mailed Apr. 17, 2015, 7 pgs.

* cited by examiner

US 9,112,066 B2

METHOD OF FABRICATING A SOLAR CELL WITH A TUNNEL DIELECTRIC LAYER

CROSS-REFERENCE TO RELATED APPLICATIONS

This application is a continuation of U.S. patent application Ser. No. 13/677,611, filed Nov. 15, 2012, which is a continuation of U.S. patent application Ser. No. 12/829,922, filed Jul. 2, 2010, now U.S. Pat. No. 8,334,161, issued Dec. 18, 2012, the entire contents of which are hereby incorporated by reference herein.

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, methods of fabricating solar cells with tunnel dielectric layers.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are connected to metal contacts on the solar cell to direct an electrical current from the cell to an external circuit coupled thereto.

Efficiency is an important characteristic of a solar cell as it is directly related to the solar cell's capability to generate power. Accordingly, techniques for increasing the efficiency of solar cells are generally desirable. Embodiments of the present invention allow for increased solar cell efficiency by providing novel processes for fabricating solar cell structures.

DETAILED DESCRIPTION

Figure 1:
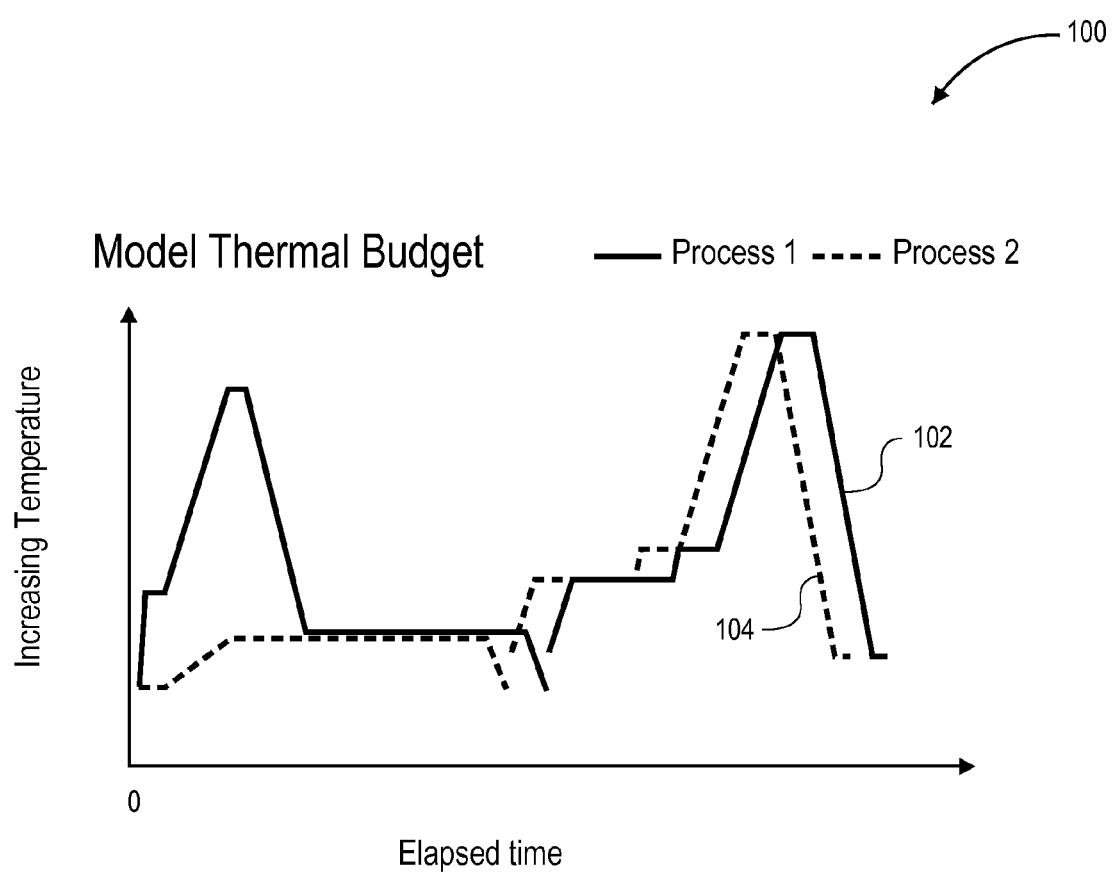
FIG. 1 illustrates a model thermal budget for a conventional process as compared to a reduced thermal budget process for fabricating a tunnel dielectric layer in a solar cell, in accordance with an embodiment of the present invention.

Methods of fabricating solar cells with tunnel dielectric layers are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic and etch techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating solar cells with tunnel dielectric layers. In one embodiment, a method of fabricating a solar cell includes exposing a surface of a substrate of the solar cell to a wet chemical solution to provide an oxide layer on the surface of the substrate. The oxide layer is then heated in a dry atmosphere at a temperature near or above 900 degrees Celsius to convert the oxide layer to a tunnel dielectric layer of the solar cell. In one embodiment, a method of fabricating a solar cell includes forming, at a temperature less than 600 degrees Celsius, an oxide layer on a surface of a substrate of the solar cell by thermal oxidation. The oxide layer is then heated in a dry atmosphere at a temperature near or above 900 degrees Celsius to convert the oxide layer to a tunnel dielectric layer of the solar cell.

Also disclosed herein are solar cells. In one embodiment, a solar cell includes a substrate. A tunnel dielectric layer is disposed on the substrate, the tunnel dielectric layer formed by heating an oxide layer near or above 900 degrees Celsius only once.

In accordance with an embodiment of the present invention, the thermal budget in a polysilicon/tunnel oxide process is reduced. For example, in a convention process, a tunnel oxide may be grown at approximately 900 degrees Celsius at relatively low pressure. However, in an embodiment, it has been found that such an approach is inadequate for optimal efficiency due to a high thermal budget. A high thermal budget can disadvantageously increase cycle time and equipment wear, both factors that can increase the overall cost of production. In a specific embodiment, it has been found that the conventional approach leads to a high cycle time for the polysilicon deposition process.

In accordance with an embodiment of the present invention, a tunnel dielectric layer is included in a solar cell to block minority carriers. In one embodiment, the thickness of the tunnel dielectric layer is approximately 15 Angstroms. However, the thermal budget conventionally required to form such a tunnel dielectric layer may accelerate the formation of defects in other portions of the solar cell, for example in the substrate of a bulk substrate, back-contact solar cell. Therefore, when applying conventional approaches, there may be a trade-off for the benefits provided by including a tunnel dielectric layer with the damaging effects of the increased thermal budget typically needed to fabricate such a layer. Thus, in accordance with an embodiment of the present invention, approaches provided herein allow for fabrication of a tunnel dielectric layer for use in high efficiency solar cell designs, but with a reduced thermal budget. In one embodiment, by reducing the thermal budget, defects otherwise exacerbated with increased thermal exposure are reduced or mitigated. In a specific embodiment, the fabrication processes used to provide a tunnel dielectric layer are limited to processes performed at temperatures near or less than 700 degrees Celsius, with application of a process near or greater than a temperature of 900 degrees Celsius being used only once in the entire process. In a particular embodiment, this approach also reduces the overall cycle time, increasing the efficiency of in-line fabrication of solar cells.

In an embodiment, growth of thin silicon oxide, including silicon dioxide ($SiO_2$), layers for tunnel in structures with polysilicon contacts is improved in the fabrication of solar cells. For example, improvements may include one or more of the following film attributes: a high performance yet thin tunnel dielectric film, controlled thickness, controlled quality, reduced process cycle time, and reduced process thermal budget. In an embodiment, by applying one or more of the approaches described herein, a very thin silicon oxide (e.g., $SiO_2$) tunnel oxide with good thickness control across a broad substrate is achieved at a relatively low temperature (e.g., reduced thermal budget) and with a relatively short cycle time. In one embodiment, a peak temperature of approximately 565 degrees Celsius is used and the cycle time is reduced by approximately 1.5 hours in a process furnace. In one embodiment, the formation of an aqueous oxide renders wafers less susceptible to contamination. The above embodiments are contrasted to a convention approach which may include growth at approximately 900 degrees Celsius at approximately 500 mTorr of pressure.

In accordance with an embodiment of the present invention, a combination of aqueous and thermal oxide growth is used to achieve a thin, yet high quality oxide film. In one embodiment, the thickness of the oxide film is approximately in the range of 1-2 nanometers. In an embodiment, a combination of oxidants, solution chemistries, and illumination is used to increase the growth rate of an oxide and improve thickness uniformity during an aqueous growth portion of the process. In one embodiment, a formed oxide is then further thickened during a low temperature thermal operation that concurrently improves the quality of the aqueous grown portion of the oxide. In an embodiment, aqueous and thermal growth techniques are combined and a low temperature thermal oxide growth process (e.g., reduced thermal budget) is performed to provide a high quality tunnel dielectric layer.

In an aspect of the present invention, a thermal budget is reduced in comparison to a conventional approach in the fabrication of a tunnel dielectric layer. For example, FIG. 1 illustrates a model thermal budget for a conventional process as compared to a reduced thermal budget process for fabricating a tunnel dielectric layer in a solar cell, in accordance with an embodiment of the present invention.

Referring to FIG. 1, a plot 100 of model thermal budget is demonstrated for temperature, in degrees Celsius, as a function of elapsed time, in minutes, for a conventional process 102 and a reduced thermal budget process 104, in accordance with an embodiment of the present invention. In one embodiment, the conventional process 102 involves heating near to or above approximately 900 degrees Celsius more than once in the fabrication of a tunnel dielectric layer. By contrast, in one embodiment, the reduced thermal budget process 104 involves heating near to or above approximately 900 degrees Celsius only once in the fabrication of a tunnel dielectric layer, as depicted in FIG. 1.

Figure 2:
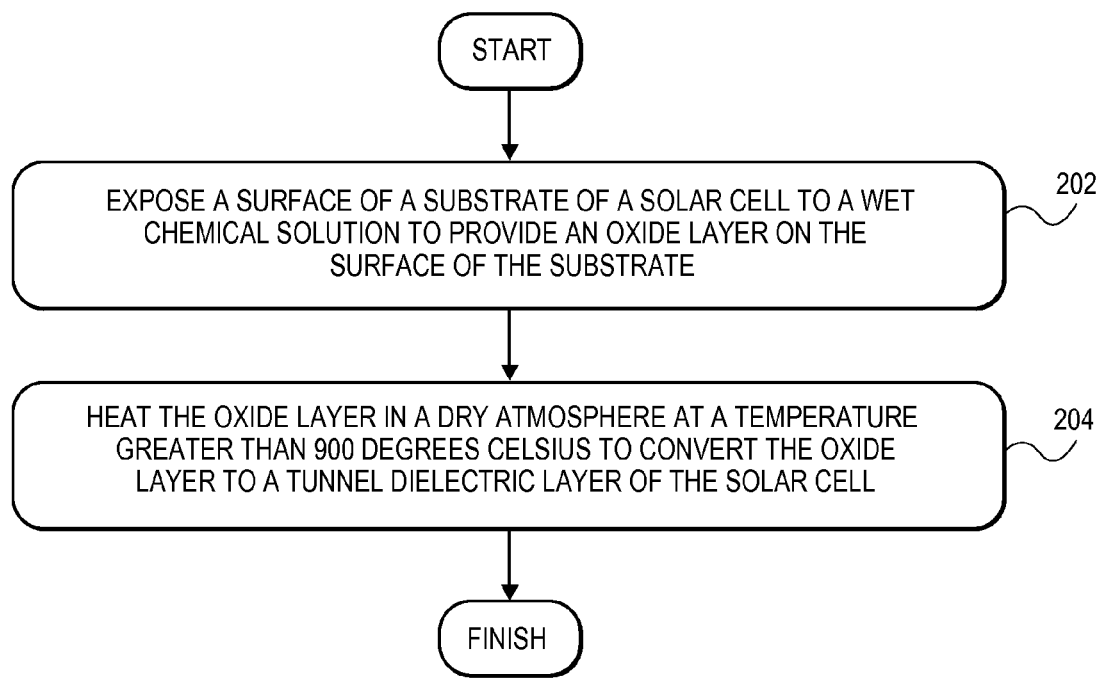
FIG. 2 illustrates a flowchart representing operations in a method of fabricating a solar cell with a tunnel dielectric layer, in accordance with an embodiment of the present invention.
Figure 3A:
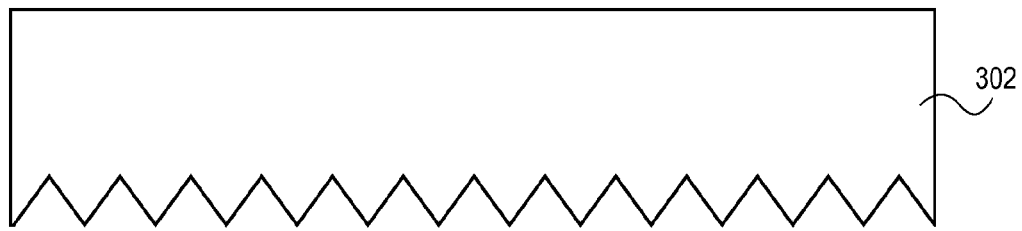
FIG. 3A illustrates a cross-sectional view of a stage in the fabrication of a solar cell including a tunnel dielectric layer, in accordance with an embodiment of the present invention.
Figure 3B:
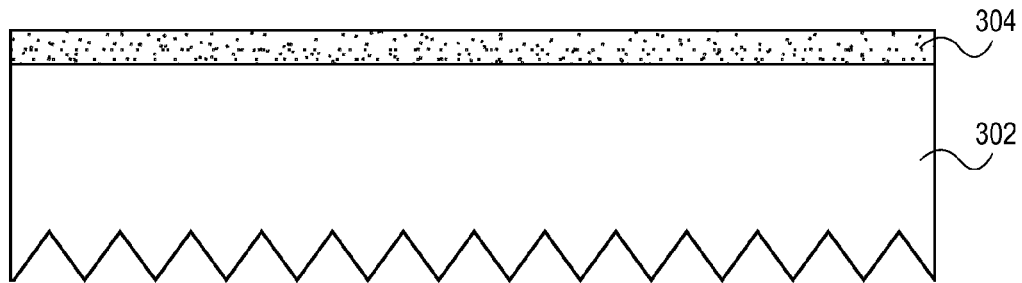
FIG. 3B illustrates a cross-sectional view of a stage in the fabrication of a solar cell including a tunnel dielectric layer, corresponding to operation 202 of the flowchart of FIG. 2 and to operation 402 of the flowchart of FIG. 4, in accordance with an embodiment of the present invention.
Figure 3C:
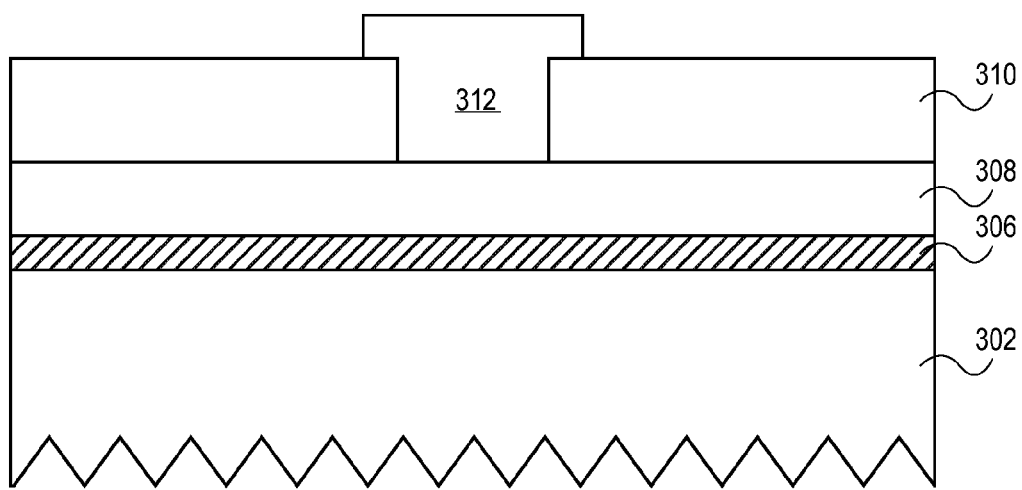
FIG. 3C illustrates a cross-sectional view of a stage in the fabrication of a solar cell including a tunnel dielectric layer, corresponding to operation 204 of the flowchart of FIG. 2 and to operation 404 of the flowchart of FIG. 4, in accordance with an embodiment of the present invention.

A solar cell may be fabricated to include a tunnel dielectric layer. For example, FIG. 2 illustrates a flowchart 200 representing operations in a method of fabricating a solar cell with a tunnel dielectric layer, in accordance with an embodiment of the present invention. FIGS. 3A-3C illustrate cross-sectional views of various stages in the fabrication of a solar cell including a tunnel dielectric layer, corresponding to operations of flowchart 200, in accordance with an embodiment of the present invention.

Referring to FIG. 3A, a substrate 302 for solar cell manufacturing is provided. In accordance with an embodiment of the present invention, substrate 302 is composed of a bulk silicon substrate. In one embodiment, the bulk silicon substrate is doped with N-type dopants. In an embodiment, substrate 302 has a textured surface, as is depicted in FIG. 3A.

Referring to operation 202 of flowchart 200, and corresponding FIG. 3B, a method of fabricating a solar cell includes exposing a surface of substrate 302 to a wet chemical solution to provide an oxide layer 304 on the surface of substrate 302. In accordance with an embodiment of the present invention, the wet chemical solution includes an oxidizer such as, but not limited to, ozone ($O_3$) or hydrogen peroxide ($H_2O_2$). In one embodiment, the wet chemical solution and the surface of the substrate are exposed to visible light radiation during oxide growth. In an embodiment, substrate 302 is a bulk silicon substrate and oxide layer 304 is a silicon oxide layer.

Referring to operation 204 of flowchart 200, and corresponding FIG. 3C, the method of fabricating a solar cell further includes heating oxide layer 304 in a dry atmosphere at a temperature near or above 900 degrees Celsius to convert oxide layer 304 to a tunnel dielectric layer 306 of the solar cell. In accordance with an embodiment of the present invention, oxide layer 304 is exposed to a temperature near or above 900 degrees Celsius only once during the fabricating. In an embodiment, subsequent to the exposing of operation 202 and prior to the heating of operation 204, oxide layer 304 is heated from a temperature below 500 degrees Celsius, to a temperature of approximately 565 degrees Celsius, and then cooled back to a temperature below 500 degrees Celsius.

In accordance with an embodiment of the present invention, the method of fabricating a solar cell further includes forming a material layer 308 above oxide layer 304 prior to the heating of operation 204. In one embodiment, material layer 308 is an amorphous silicon layer, and the amorphous silicon layer is crystallized to a polysilicon layer during the heating of operation 204. In a specific embodiment, the method of fabricating a solar cell further includes forming a metal contact 312 above the polysilicon layer 308, as depicted in FIG. 3C.

Thus, referring again to FIG. 3C, and in accordance with an embodiment of the present invention, a solar cell includes a substrate 302. A tunnel dielectric layer 306 is disposed on substrate 302, the tunnel dielectric layer formed by heating an oxide layer (304 from FIG. 3B) near or above 900 degrees Celsius only once. In one embodiment, the solar cell further includes a polysilicon layer 308 disposed above tunnel dielectric layer 306. In a specific embodiment, the solar cell of further includes a metal contact 312 disposed above polysilicon layer 308. In an embodiment, substrate 302 is a bulk silicon substrate and tunnel dielectric layer 306 is a silicon oxide layer.

In an embodiment, the solar cell is a back-contact solar cell. In that embodiment, the back contact solar cell includes P-type and N-type active regions in substrate 302. Conductive contacts, such as contact 312, are coupled to the active regions and are separated from one another by isolation regions, such as isolation regions 310 which may be composed of a dielectric material. In an embodiment, the solar cell is a back-contact solar cell and an anti-reflective coating layer is disposed on the light-receiving surface, such as the random textured surface depicted in FIGS. 3A-3C. In one embodiment, the anti-reflective coating layer is a layer of silicon nitride with a thickness approximately in the range of 70-80 nanometers.

Figure 4:
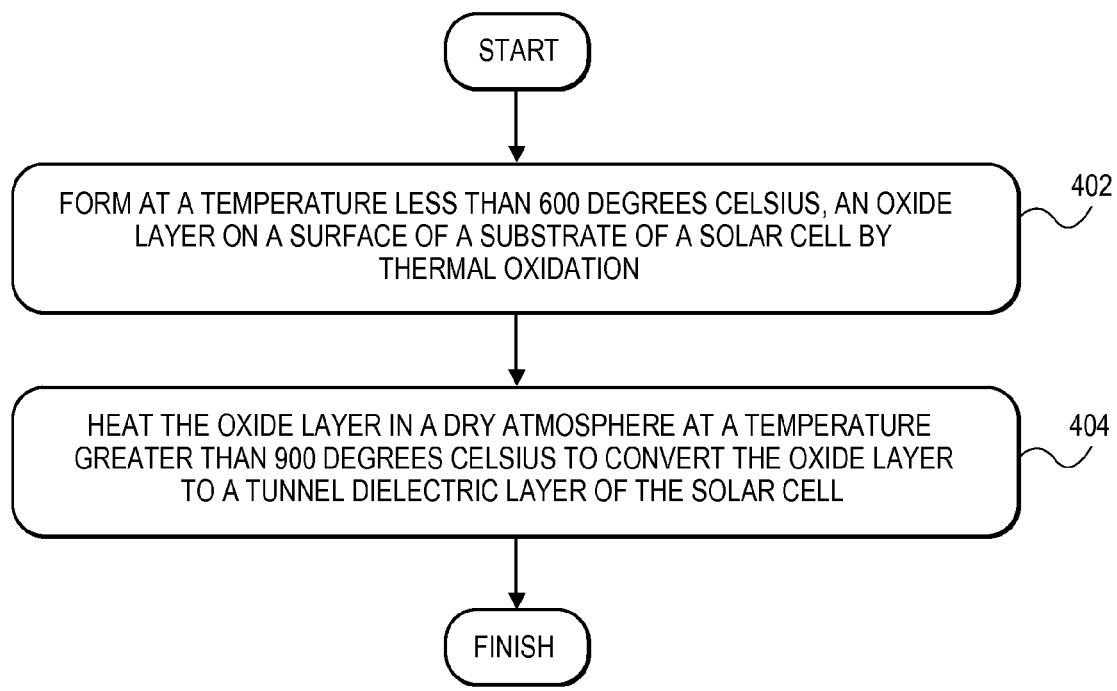
FIG. 4 illustrates a flowchart representing operations in a method of fabricating a solar cell with a tunnel dielectric layer, in accordance with an embodiment of the present invention.

In another aspect of the present invention, a solar cell may be fabricated by to include a tunnel dielectric layer without the use of an aqueous treatment. For example, FIG. 4 illustrates a flowchart 400 representing operations in a method of fabricating a solar cell with a tunnel dielectric layer, in accordance with an embodiment of the present invention. FIGS. 3A-3C illustrate cross-sectional views of various stages in the fabrication of a solar cell including a tunnel dielectric layer, corresponding to operations of flowchart 400, in accordance with an embodiment of the present invention.

Referring to FIG. 3A, a substrate 302 for solar cell manufacturing is provided. In accordance with an embodiment of the present invention, substrate 302 is composed of a bulk silicon substrate. In one embodiment, the bulk silicon substrate is doped with N-type dopants. In an embodiment, substrate 302 has a textured surface, as is depicted in FIG. 3A.

Referring to operation 402 of flowchart 400, and corresponding FIG. 3B, a method of fabricating a solar cell includes forming, at a temperature less than 600 degrees Celsius, an oxide layer 304 on a surface of substrate 302 of the solar cell by thermal oxidation. In accordance with an embodiment of the present invention, oxide layer 304 is formed by a low-pressure thermal oxidation process. In one embodiment, the low-pressure thermal oxidation process is performed at a temperature approximately in the range of 500-580 degrees Celsius in an atmosphere including oxygen ($O_2$). In an embodiment, substrate 302 is a bulk silicon substrate and oxide layer 304 is a silicon oxide layer.

Referring to operation 404 of flowchart 400, and corresponding FIG. 3C, the method of fabricating a solar cell further includes heating oxide layer 304 in a dry atmosphere at a temperature near or above 900 degrees Celsius to convert oxide layer 304 to a tunnel dielectric layer 306 of the solar cell. In accordance with an embodiment of the present invention, oxide layer 304 is exposed to a temperature near or above 900 degrees Celsius only once during the fabricating. In an embodiment, subsequent to the forming of operation 402 and prior to the heating of operation 404, oxide layer 304 is heated from a temperature below 500 degrees Celsius, to a temperature of approximately 565 degrees Celsius, and then cooled back to a temperature below 500 degrees Celsius.

In accordance with an embodiment of the present invention, the method of fabricating a solar cell further includes forming a material layer 308 above oxide layer 304 prior to the heating of operation 404. In one embodiment, material layer 308 is an amorphous silicon layer, and the amorphous silicon layer is crystallized to a polysilicon layer during the heating of operation 404. In a specific embodiment, the method of fabricating a solar cell further includes forming a metal contact 312 above the polysilicon layer 308, as depicted in FIG. 3C.

Figure 5A:
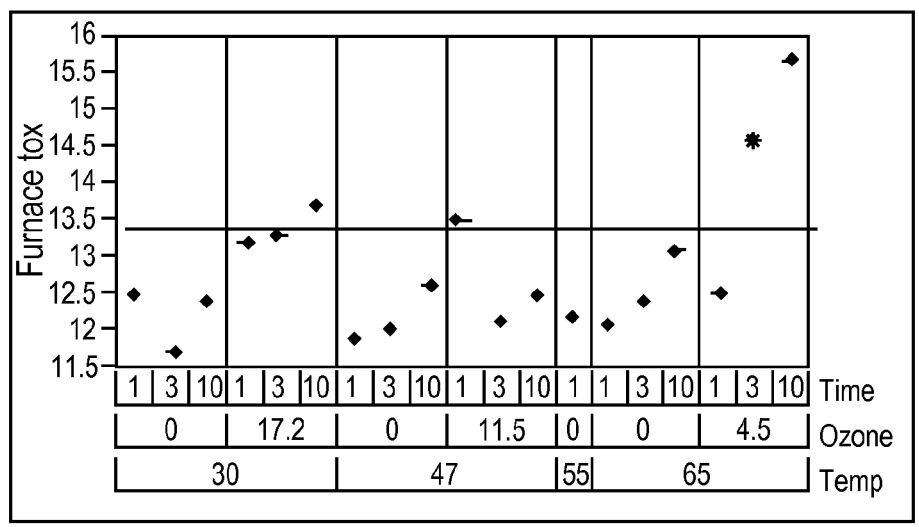
FIG. 5A illustrates a plot of tunnel oxide thickness after combined aqueous and thermal growth operations, in accordance with an embodiment of the present invention.
Figure 5B:
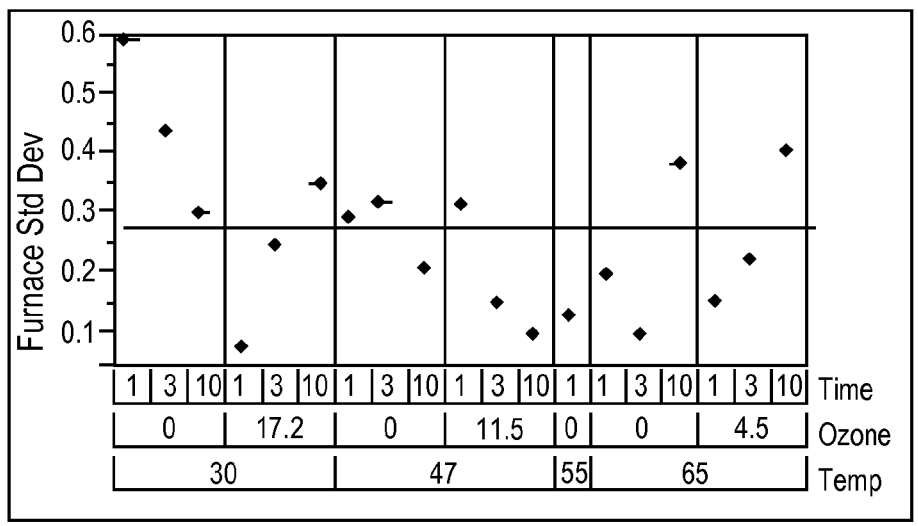
FIGS. 5B illustrates a plot of standard deviation of oxide thickness after combined aqueous and thermal growth operations, in accordance with an embodiment of the present invention.
Figure 6A:
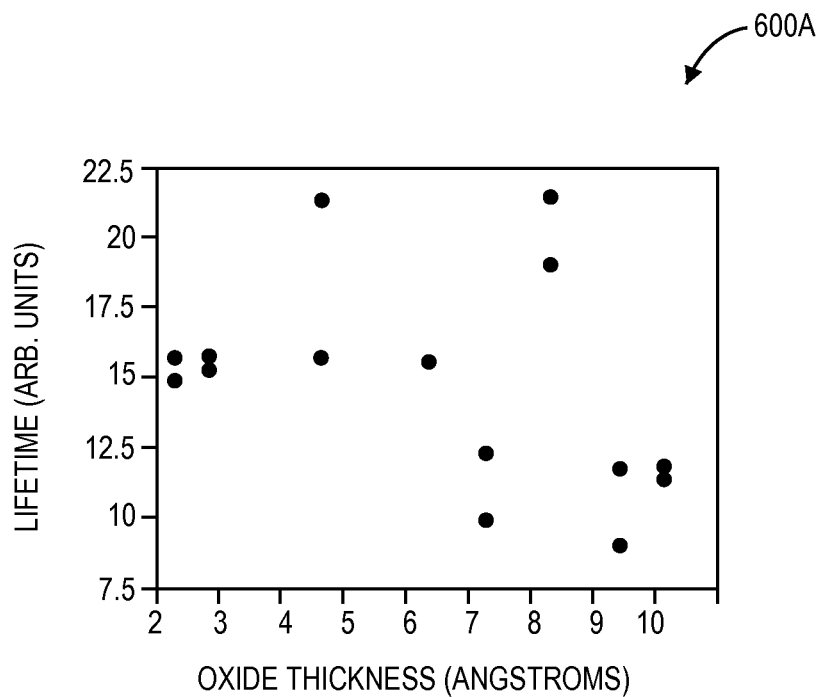
FIGS. 6A illustrates a plot of minority carrier lifetime as a function of thickness of the aqueous film component of a tunnel dielectric layer, in accordance with an embodiment of the present invention.
Figure 6B:
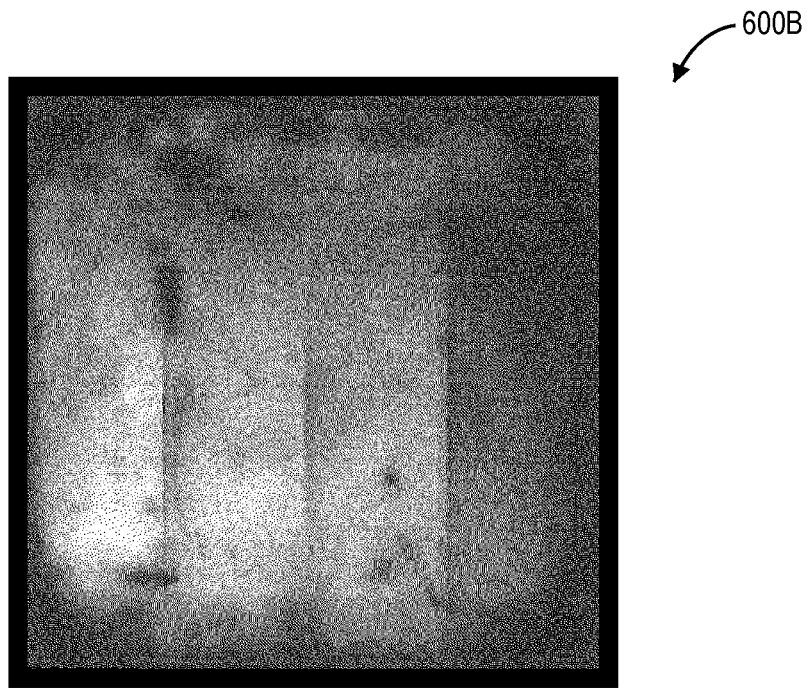
FIG. 6B illustrates a photoluminescence result of lifetime wafers subjected to oxide formation from a combination of aqueous and thermal processing, in accordance with an embodiment of the present invention.

As described above, in an aspect of the present invention, a tunnel dielectric layer (e.g., a tunnel oxide layer) may be fabricated by a combination of aqueous and thermal treatments of a substrate. FIGS. 5A-5B illustrate plots 500A and 500B, respectively, of tunnel oxide thickness and standard deviation of oxide thickness, respectively, after combined aqueous and thermal growth operations, in accordance with an embodiment of the present invention. Referring to plots 500A and 500B, the aqueous growth time, solution zone concentration and temperature were varied. As a reference, the thermal oxidation performed was the same in all cases. FIG. 6A illustrates a plot 600A of minority carrier lifetime as a function of thickness of the aqueous film component of a tunnel dielectric layer, in accordance with an embodiment of the present invention. FIG. 6B illustrates a photoluminescence result 600B of lifetime wafers subjected to oxide formation from a combination of aqueous and thermal processing, in accordance with an embodiment of the present invention. As evidenced from the variety of film types fabricated shown in the above plots, and in accordance with an embodiment of the present invention, specific desired properties for a tunnel dielectric film may be tuned by tuning the aqueous treatment portion of the growth process.

As described above, in another aspect of the present invention, a tunnel dielectric layer (e.g., a tunnel oxide layer) may be fabricated by exposing an oxide layer to a temperature greater than approximately 900 degrees Celsius only once during the fabricating. In an embodiment, thermal oxidation is performed at a temperature near or substantially the same as the temperature desired for the next fabrication step. One such step can be the formation of a silicon layer above the tunnel oxide layer. Accordingly, in one embodiment, thermal oxidation is performed at only approximately 575 degrees Celsius.

Thus, methods of fabricating solar cells with tunnel dielectric layers have been disclosed. In accordance with an embodiment of the present invention, a method of fabricating a solar cell includes exposing a surface of a substrate of the solar cell to a wet chemical solution to provide an oxide layer on the surface of the substrate. The method also includes heating the oxide layer in a dry atmosphere at a temperature near or above 900 degrees Celsius to convert the oxide layer to a tunnel dielectric layer of the solar cell. In one embodiment, the oxide layer is exposed to a temperature near or above 900 degrees Celsius only once during the fabricating. In accordance with another embodiment of the present invention, a method of fabricating a solar cell includes forming, at a temperature less than 600 degrees Celsius, an oxide layer on a surface of a substrate of the solar cell by thermal oxidation. The method also includes heating the oxide layer in a dry atmosphere at a temperature near or above 900 degrees Celsius to convert the oxide layer to a tunnel dielectric layer of the solar cell. In one embodiment, the oxide layer is exposed to a temperature near or above 900 degrees Celsius only once during the fabricating.

What is claimed is:

1. A method of fabricating a solar cell, the method comprising:
consuming a portion of a substrate of the solar cell to provide a surface oxide layer of the substrate by exposing the substrate to a wet chemical solution; and
heating the surface oxide layer from a temperature below 500 degrees Celsius, to a temperature above 500 degrees Celsius, and then cooling back to a temperature below 500 degrees Celsius.

2. The method of claim 1, wherein the wet chemical solution comprises an oxidizer selected from the group consisting of ozone ($O_3$) and hydrogen peroxide ($H_2O_2$).

3. The method of claim 2, wherein the wet chemical solution and the substrate are exposed to visible light radiation during the exposing.

4. The method of claim 1, wherein heating the surface oxide layer to the temperature above 500 degrees Celsius comprises heating to a temperature of approximately 565 degrees Celsius.

5. The method of claim 1, further comprising:
forming a material layer above the surface oxide layer.

6. The method of claim 5, wherein forming the material layer comprises forming a polysilicon layer during the heating.

7. The method of claim 6, wherein heating the surface oxide layer comprises forming a tunnel oxide layer, and wherein forming the polysilicon layer comprises forming an N+ type or P+ type active region on the tunnel oxide layer.

8. The method of claim 6, further comprising:
forming a metal contact above the polysilicon layer.

9. The method of claim 1, wherein the substrate comprises silicon and the oxide layer comprises silicon oxide.

10. The method of claim 1, wherein the substrate is a bulk silicon substrate.

11. A method of fabricating a solar cell, the method comprising:
consuming a portion of a substrate of the solar cell to provide a surface oxide layer of the substrate by thermal oxidation; and
heating the surface oxide layer from a temperature below 500 degrees Celsius, to a temperature above 500 degrees Celsius, and then cooling back to a temperature below 500 degrees Celsius.

12. The method of claim 11, wherein the surface oxide layer is formed by a low-pressure thermal oxidation process.

13. The method of claim 12, wherein the low-pressure thermal oxidation process is performed in an atmosphere comprising oxygen ($O_2$).

14. The method of claim 11, further comprising:
forming a material layer above the surface oxide layer.

15. The method of claim 14, wherein forming the material layer comprises forming a polysilicon layer during the heating.

16. The method of claim 15, wherein heating the surface oxide layer comprises forming a tunnel oxide layer, and wherein forming the polysilicon layer comprises forming an N+ type or P+ type active region on the tunnel oxide layer.

17. The method of claim 15, further comprising:
forming a metal contact above the polysilicon layer.

18. The method of claim 11, wherein the substrate comprises silicon and the oxide layer comprises silicon oxide.

19. The method of claim 11, wherein the substrate is a bulk silicon substrate.

20. The method of claim 11, wherein heating the surface oxide layer to the temperature above 500 degrees Celsius comprises heating to a temperature of approximately 565 degrees Celsius.

* * * * *